United States Patent
Cheng

(10) Patent No.: US 11,129,308 B1
(45) Date of Patent: Sep. 21, 2021

(54) SERVER WITH A VIBRATION SENSING FUNCTION

(71) Applicant: ABLECOM TECHNOLOGY INC., Taoyuan (TW)

(72) Inventor: Hsun-Hui Cheng, Taoyuan (TW)

(73) Assignee: ABLECOM TECHNOLOGY INC., Taoyuan (TW)

( * ) Notice: Subject to any disclaimer, the term of this patent is extended or adjusted under 35 U.S.C. 154(b) by 46 days.

(21) Appl. No.: 16/845,448

(22) Filed: Apr. 10, 2020

(51) Int. Cl.
*G08B 21/00* (2006.01)
*H05K 7/20* (2006.01)
*G08B 21/18* (2006.01)
*G01H 1/00* (2006.01)

(52) U.S. Cl.
CPC ......... *H05K 7/20836* (2013.01); *G01H 1/003* (2013.01); *G08B 21/182* (2013.01); *H05K 7/20727* (2013.01)

(58) Field of Classification Search
CPC ........... H05K 7/20836; H05K 7/20727; G01H 1/003; G08B 21/182
USPC ...................................................... 340/665
See application file for complete search history.

(56) References Cited

U.S. PATENT DOCUMENTS

| | | | | |
|---|---|---|---|---|
| 5,517,183 A | * | 5/1996 | Bozeman, Jr. | G01H 1/00 340/669 |
| 2002/0118121 A1 | * | 8/2002 | Lehrman | A61B 5/1117 340/870.16 |
| 2003/0095688 A1 | * | 5/2003 | Kirmuss | G08B 13/19647 382/105 |
| 2007/0089011 A1 | * | 4/2007 | Dodeja | G05B 23/0235 714/742 |
| 2007/0127807 A1 | * | 6/2007 | Koshikawa | G06K 9/00 382/149 |
| 2007/0188321 A1 | * | 8/2007 | Stenlund | B60R 25/305 340/539.26 |
| 2009/0067080 A1 | * | 3/2009 | Gross | G11B 33/08 360/71 |
| 2012/0275610 A1 | * | 11/2012 | Lambert | G10K 11/16 381/56 |
| 2014/0111935 A1 | * | 4/2014 | Ito | G06F 1/203 361/679.48 |
| 2015/0081132 A1 | * | 3/2015 | Shirokaze | G06F 1/206 700/300 |
| 2017/0209338 A1 | * | 7/2017 | Potucek | F04D 29/708 |
| 2018/0059745 A1 | * | 3/2018 | Gross | G06F 1/206 |
| 2019/0094105 A1 | * | 3/2019 | Tang | G01M 7/025 |
| 2019/0137126 A1 | * | 5/2019 | Desrochers | F24F 11/49 |
| 2019/0154494 A1 | * | 5/2019 | Gross | G06F 1/20 |
| 2020/0241520 A1 | * | 7/2020 | Gross | G05B 23/0283 |

(Continued)

*Primary Examiner* — Naomi J Small
(74) *Attorney, Agent, or Firm* — Chun-Ming Shih; HDLS IPR Services

(57) ABSTRACT

A server with a vibration sensing function includes a cooling fan (10), a vibration sensing module (20) and a computing module (30). The vibration sensing module (20) is disposed in the server and is physically coupled to the cooling fan (10). The vibration sensing module (20) obtains a monitoring value that is updated continuously by detecting a vibration of the cooling fan (10). When the vibration sensing module (20) confirms that the monitoring value matches a threshold value, the vibration sensing module (20) outputs a warning message. The computing module (30) receives the monitoring values and the warning message.

14 Claims, 12 Drawing Sheets

(56) References Cited

U.S. PATENT DOCUMENTS

2020/0340496 A1\* 10/2020 Li ........................ G01H 1/003
2021/0097904 A1\* 4/2021 Taylor .................... G08G 1/20

\* cited by examiner

SERVER WITH A VIBRATION SENSING FUNCTION

BACKGROUND

Technical Field

The present disclosure relates to a server, and more particularly to a server with a vibration sensing function.

Description of Related Art

The statements in this section merely provide background information related to the present disclosure and do not necessarily constitute prior art.

With the vigorous development of modern science and technology, most of electronic apparatus are moving toward complexity, high speed, and automation, and an interdependence between the electronic apparatus is becoming increasingly high. When one of the electronic apparatus fails, it may cause an interruption of an entire process or production a process with high possibility. In order to control the actual operating status of the electronic apparatus, it is necessary to diagnose whether the electronic apparatus is faulty in real time, especially for online detection and diagnosis related to safety. For example, heat-dissipating components of the electronic apparatus that generating high temperature.

Generally, the heat dissipation component for electronic apparatus is a fan. Since the fan is a mechanical device that continuously generates a moment of inertia, if a centroid of the fan shifts due to process tolerance or long-term wear etc., it may cause an abnormal vibration. In the field of servers, the impact caused by a phenomenon of the abnormal vibration is not only a problem of resonance with other objects of the server, but also affects the reliability of the most important storage modules. In addition, the abnormal vibration of the fan not only affects the lifetime of the fan itself, but also means that the fan may be about to be damaged. For electronic apparatus that generates high temperatures, it may burn down quickly after the fan has stopped operating, or cause a more serious disaster.

However, a person with an ordinary skill can only understand a current status of whether the fan is running, the speed of the fan, and the temperature of the electronic apparatus etc., and cannot actively warn before the fan is about to be damaged. It is often too late to react when a problem occurs, causing loss of server hardware or software.

Therefore, how to design a server with the vibration sensing function to solve the technical problems above and improve the safety of using the server is an important subject studied by the inventors and proposed in the present disclosure.

SUMMARY

A purpose of the present disclosure is to provide a server with the vibration sensing function, which can actively warn before the fan is about to be damaged, it can not only avoid the problem of resonance of the abnormal vibration, ensuring the reliability of the storage modules, avoiding a damage of electronic apparatus due to high temperature, and achieve the purpose of improving the safety of using the server.

In order to achieve the purpose, the server with the vibration sensing function of the present disclosure includes a cooling fan, a vibration sensing module and a computing module. The cooling fan disposed in the server. The vibration sensing module disposed in the server and physically coupled to the cooling fan, the vibration sensing module including a microcontroller, an accelerometer and a DIP switch, the DIP switch is easily changeable and is configured to set a threshold value according to requirements, the accelerometer is configured to obtain a monitoring value updated continuously by detecting a vibration of the cooling fan, the microcontroller is coupled to the accelerometer and the DIP switch, when the microcontroller confirms that the monitoring value matches the threshold value, the microcontroller outputs a warning message. The computing module disposed in the server and electrically coupled to the vibration sensing module, the computing module including a central processing unit (CPU), and the CPU receiving the warning message.

Further, the vibration sensing module is disposed on an outer surface of a bearing base of the cooling fan, and the accelerometer is configured to detect the vibration of the cooling fan by detecting a vibration of the outer surface of the bearing base.

Further, the number of the cooling fan and the vibration sensing module are multiple, and each of the vibration sensing modules is respectively disposed on an outer surface of a bearing base of the cooling fan.

Further, the server with the vibration sensing function further includes a GPIO expansion board, the GPIO expansion board includes a general purpose input and output integrated circuit (GPIO IC), the GPIO IC coupled to a plurality of the vibration sensing modules, the GPIO IC is configured to identify any one of the vibration sensing modules that outputs the warning message, and is configured to transmit the warning message to the CPU.

Further, the server with the vibration sensing function further includes a motherboard and a GPIO expansion board removably inserted on the motherboard, the CPU disposed on the motherboard, the GPIO IC disposed on the GPIO expansion board, and the GPIO IC coupled to the CPU through the GPIO expansion board and the motherboard.

Further, the GPIO expansion board includes a plurality of ports, the plurality of the ports are coupled to the GPIO IC, and each of the plurality of the ports is electrically coupled to one of the vibration sensing modules, so that the GPIO IC is electrically coupled to a plurality of the microcontrollers.

Further, the server with the vibration sensing function further includes a motherboard and a USB expansion board, the CPU disposed on the motherboard, the USB expansion board locked between the motherboard and a plurality of the cooling fans, the USB expansion board including a second microcontroller, a multiplexer, a plurality of ports, a USB port, a power circuit, and a plurality of tapped holes, each of the plurality of the ports is electrically coupled to one of the vibration sensing modules, the multiplexer is coupled to the plurality of the vibration sensing modules through the plurality of the ports, so that the second microcontroller is configured to identify any one of the vibration sensing modules that outputs the warning message, and is configured to transmit the warning message to the CPU through the USB port, the power circuit is configured to supply power to the second microcontroller or the multiplexer through the USB port.

Further, the vibration sensing module is disposed on a fan frame that carries the cooling fan, and the accelerometer is configured to detect the vibration of the cooling fan by detecting a vibration of the fan frame.

Further, the number of the cooling fans is plural, and the vibration sensing module is disposed on a fan frame that carries one of the cooling fans or carries all the cooling fans, and the accelerometer is configured to detect the vibration of the cooling fan by detecting a vibration of the fan frame.

Further, when the microcontroller continuously confirms that the monitoring value matches the threshold value during a specific period, the microcontroller is configured to output the warning message to the CPU.

Further, the specific period is 10 seconds.

Further, the unit of the monitoring value and the threshold value is acceleration.

Further, when the CPU receives the warning message, the CPU is configured to output the warning message to outside of the server, and is configured to display the warning message on a screen or make a buzzer sound.

Further, when the CPU receives the warning message, the CPU is configured to adjust a rotating speed of the cooling fan.

When using the server with a vibration sensing function of the present disclosure, the vibration sensing module can be selected directly (the vibration sensing module is disposed on the outer surface of the bearing base of the cooling fan) or indirectly (the vibration sensing module is disposed on a fan frame that carries the cooling fan) coupled to the cooling fan. When used with the microcontroller and the accelerometer, it can have an effect of automatic monitoring. In particular, the threshold value set by the DIP switch is used. The user can further change the setting of the threshold value within the microcontroller by changing the state of the DIP switch, so that the microcontroller can compare the threshold value with the monitoring value received, and then deciding whether to output the warning message. For this reason, the server with the vibration sensing function of the present disclosure can actively warn before the fan is about to be damaged, it can not only avoid the problem of resonance of the abnormal vibration, ensuring the reliability of the storage modules, avoiding a damage of electronic apparatus due to high temperature, and achieve the purpose of improving the safety of using the server.

In order to further understand the techniques, means, and effects of the present disclosure for achieving the intended purpose. Please refer to the following detailed description and drawings of the present disclosure. The drawings are provided for reference and description only, and are not intended to limit the present disclosure.

DETAILED DESCRIPTION

Figure 1:
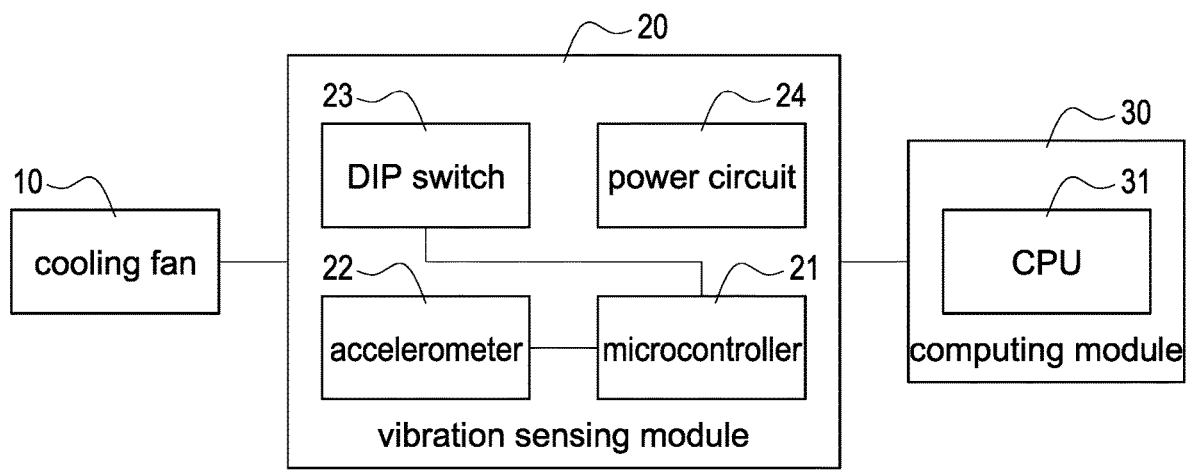
FIG. 1 is a functional block diagram of a first embodiment of the server with a vibration sensing function of the present disclosure.

The embodiments of the present disclosure are described by way of specific examples, and those skilled in the art can readily appreciate the other advantages and functions of the present disclosure. The present disclosure may be embodied or applied in various other specific embodiments, and various modifications and changes can be made without departing from the spirit and scope of the present disclosure.

It should be understood that the structures, the proportions, the sizes, the number of components, and the like in the drawings are only used to cope with the contents disclosed in the specification for understanding and reading by those skilled in the art, and it is not intended to limit the conditions that can be implemented in the present disclosure, and thus is not technically significant. Any modification of the structure, the change of the proportional relationship, or the adjustment of the size, should be within the scope of the technical contents disclosed by the present disclosure without affecting the effects and the achievable effects of the present disclosure.

The technical content and detailed description of the present disclosure will be described below in conjunction with the drawings.

Figure 2:
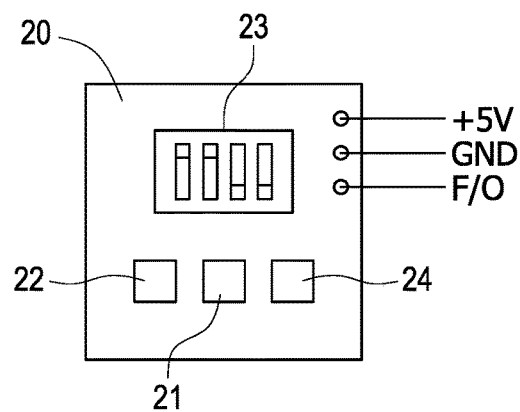
FIG. 2 is a schematic diagram of an appearance of a vibration sensing module of the server with the vibration sensing function of the present disclosure.

Please refer to FIG. 1 and FIG. 2. FIG. 1 is a functional block diagram of a first embodiment of the server with a vibration sensing function of the present disclosure. FIG. 2 is a schematic diagram of an appearance of a vibration sensing module of the server with the vibration sensing function of the present disclosure.

The server with the vibration sensing function of the first embodiment of the present disclosure includes a cooling fan 10, a vibration sensing module 20, and a computing module 30. The cooling fan 10 is disposed in the server. The vibration sensing module 20 disposed in the server and physically coupled to the cooling fan 10. The physical coupling may include direct coupling (the vibration sensing module 20 is disposed on the outer surface of the bearing base of the cooling fan 10) or indirectly coupling (the vibration sensing module 20 is disposed on a fan frame 41 that carries the cooling fan 10). As described later. As shown in FIG. 2, the vibration sensing module 20 may be a printed circuit board (PCB) configured with a microcontroller 21, an accelerometer 22, a DIP switch 23, and a power circuit 24. The three pins connected the vibration sensing module 20 to outside are +5V, GND, and Fail Output (F/O) for outputting a warning message. The power circuit 24 can supply power to the microcontroller 21 and the accelerometer 22. The DIP switch 23 is easily changeable and is configured to set a threshold value according to requirements. The threshold value is used as a basis for the microcontroller 21 to determine whether the cooling fan 10 is abnormal. Further, the user can use a measured value obtained when the cooling fan 10 is in a normal operating state as a basis for setting the threshold value of the DIP switch 23. Regarding the revision of the threshold value, the present disclosure changes the threshold setting in the microcontroller 21 by adjusting the state of the DIP switch 23 (for example, the value of each bit is 0 or 1), and then changes the threshold value.

In the first embodiment of the present disclosure, the adjustable code of the finger switch 23 has 4 bits, and the threshold values generated are as follows:

| setting | 0000 | 0001 | 0010 | 0011 | 0100 | 0101 | 0110 | 0111 |
|---|---|---|---|---|---|---|---|---|
| threshold value | 15 $m/s^2$ | 17 $m/s^2$ | 19 $m/s^2$ | 21 $m/s^2$ | 23 $m/s^2$ | 25 $m/s^2$ | 27 $m/s^2$ | 29 $m/s^2$ |
| setting | 1000 | 1001 | 1010 | 1011 | 1100 | 1101 | 1110 | 1111 |
| threshold value | 31 $m/s^2$ | 33 $m/s^2$ | 35 $m/s^2$ | 37 $m/s^2$ | 39 $m/s^2$ | 41 $m/s^2$ | 43 $m/s^2$ | 45 $m/s^2$ |

According to the actual experimental test results, if the threshold value was between 19 $m/s^2$ and 21 $m/s^2$ (the g value corresponding to the accelerometer is about 2.04 g), and meanwhile the cooling fan 10 is running at high speed, a monitoring value that was identified as the beginning of damage to the cooling fan 10 was between 30 $m/s^2$ and 40 $m/s^2$ (the g value corresponding to the accelerometer was about 3.06 g to 4.08 g), The monitored value that was identified as the cooling fan 10 has been damaged was between 70 $m/s^2$ and 80 $m/s^2$ (the g value corresponding to the accelerometer is about 7.14 g to 8.16 g).

The accelerometer 22 is configured to obtain the monitoring value updated continuously by detecting a vibration of the cooling fan 10. In the first embodiment of the present disclosure, the unit of the monitoring value and the threshold value is acceleration ($m/s^2$). The accelerometer 22 is also called an acceleration sensor, a gravity acceleration sensor, etc., and is a device for measuring acceleration. The phenomenon of vibration is often measured by a ceramic piezoelectric sensor or the accelerometer 22. Unlike long-distance sensing devices, the accelerometer 22 measures their own motion. One of the applications of the accelerometer 22 is to measure gravity (that is, a value of "g"), especially for accelerometers used in gravimetric methods, such devices are called gravimeters. In addition, the accelerometer 22 and gyroscopes can also be used in microelectromechanical systems (MEMS) in an inertial guidance system.

The microcontroller 21 is coupled to the accelerometer 22 and the DIP switch 23. When the microcontroller 21 confirms that the monitored value matches the threshold value, the microcontroller 21 outputs the warning message. Further, when the microcontroller 21 continuously confirms that the monitoring value matches the threshold value during a specific period, the microcontroller 21 outputs the warning message to the CPU 31 of the computing module 30. In the first embodiment of the present disclosure, the specific period is 10 seconds, but the present disclosure is not limited thereto.

The computing module 30 disposed in the server and electrically coupled to the vibration sensing module 20, the computing module 30 including the CPU 31, and the CPU 31 receiving the warning message so that the CPU 31 can perform other subsequent processing.

Figure 3A:
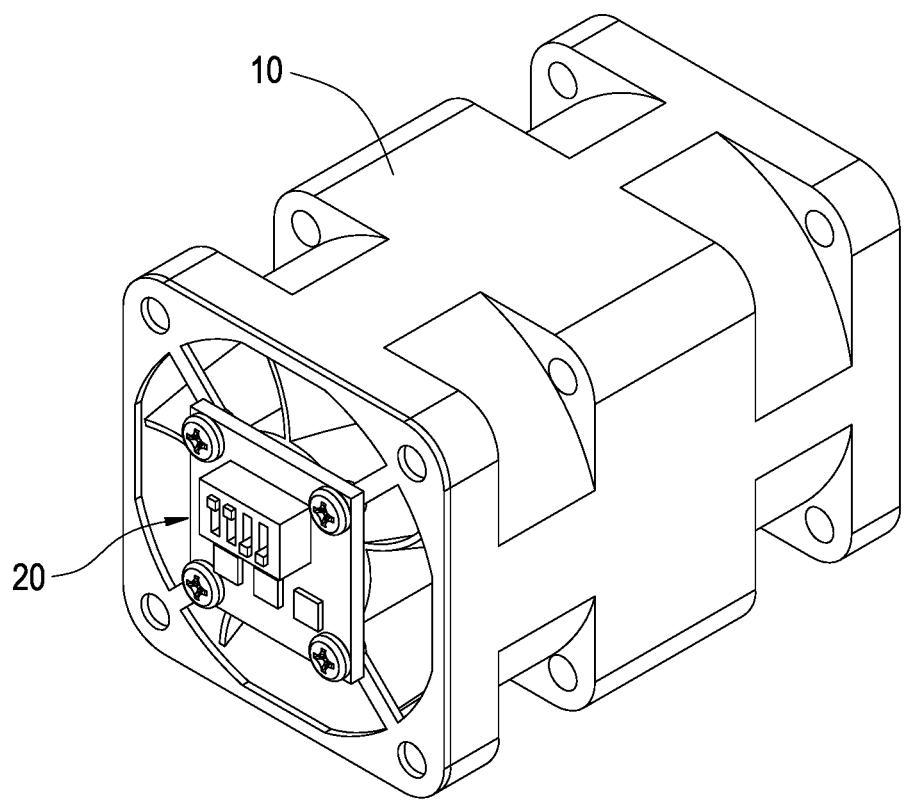
FIG. 3A and FIG. 3B are structural configuration diagrams of the first embodiment of the server with the vibration sensing function of the present disclosure.
Figure 3B:
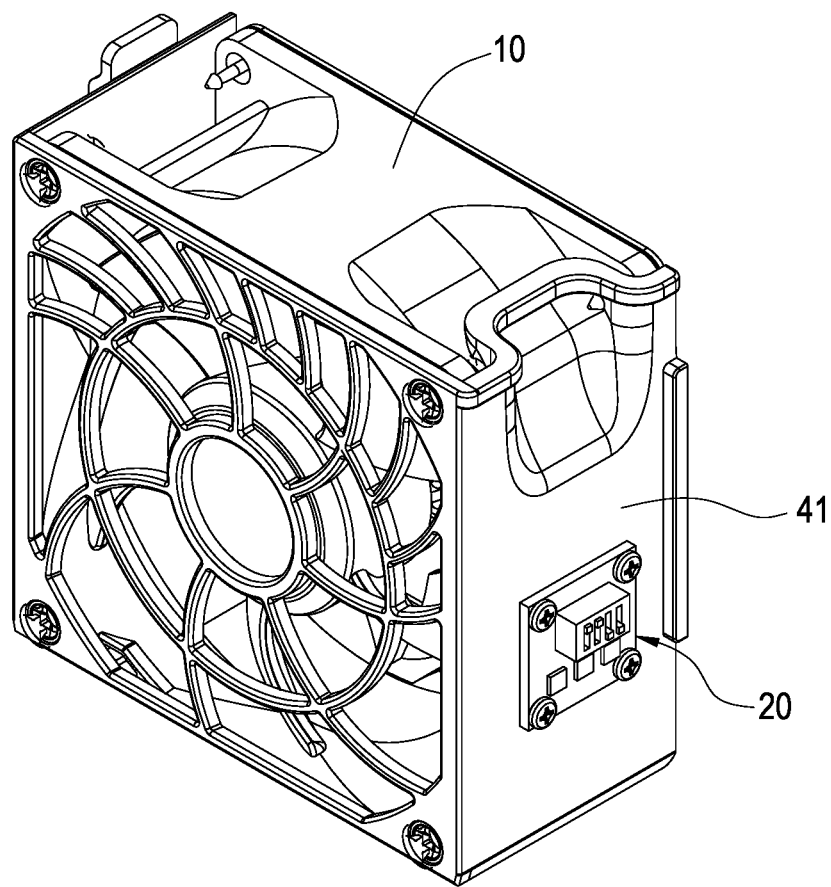

Please refer to FIG. 3A and FIG. 3B, that are structural configuration diagrams of the first embodiment of the server with the vibration sensing function of the present disclosure, that is, a configuration diagram of a single cooling fan 10. FIG. 3A shows that the vibration sensing module 20 is disposed on an outer surface of a bearing base of the cooling fan 10, and the accelerometer 22 of the vibration sensing module 20 is configured to detect the vibration of the cooling fan 10 by detecting a vibration of the outer surface of the bearing base. That is, the vibration sensing module 20 can be directly coupled to the cooling fan 10. FIG. 3B shows that the vibration sensing module 20 is disposed on the fan frame 41 that carries the cooling fan 10, and the accelerometer 22 is configured to detect the vibration of the cooling fan 10 by detecting a vibration of the fan frame 41, that is, the vibration sensing module 20 can be indirectly coupled to the cooling fan 10.

Figure 4:
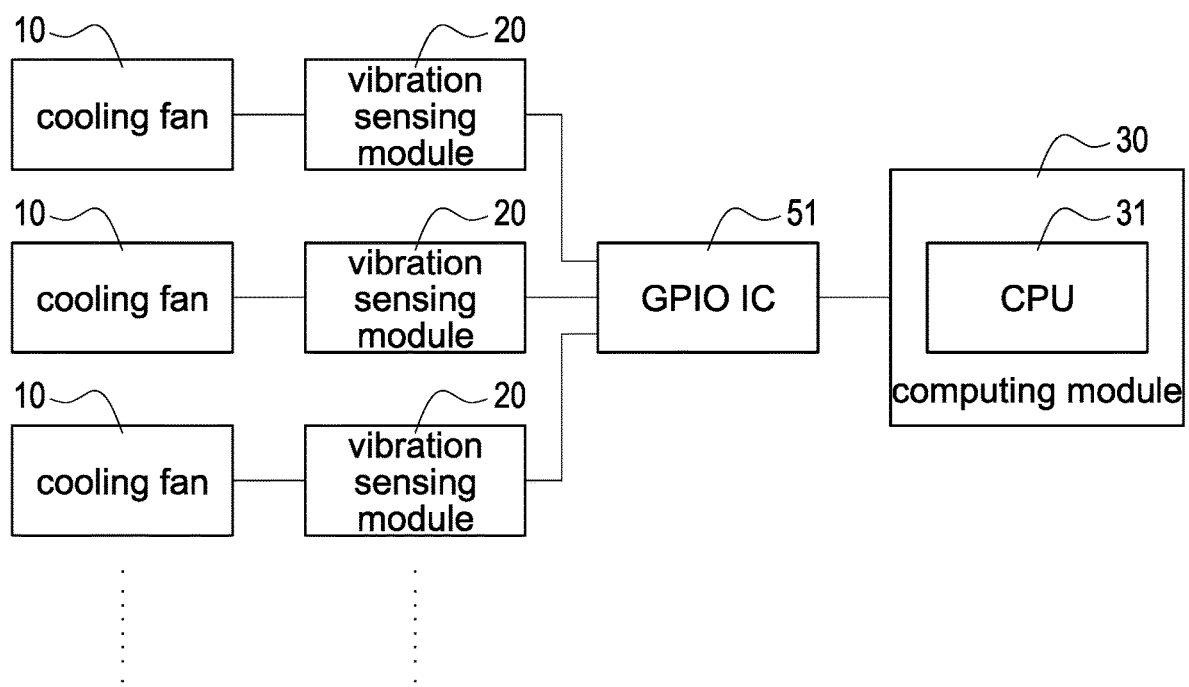
FIG. 4 is a functional block diagram of a second embodiment of the server with the vibration sensing function of the present disclosure.
Figure 5:
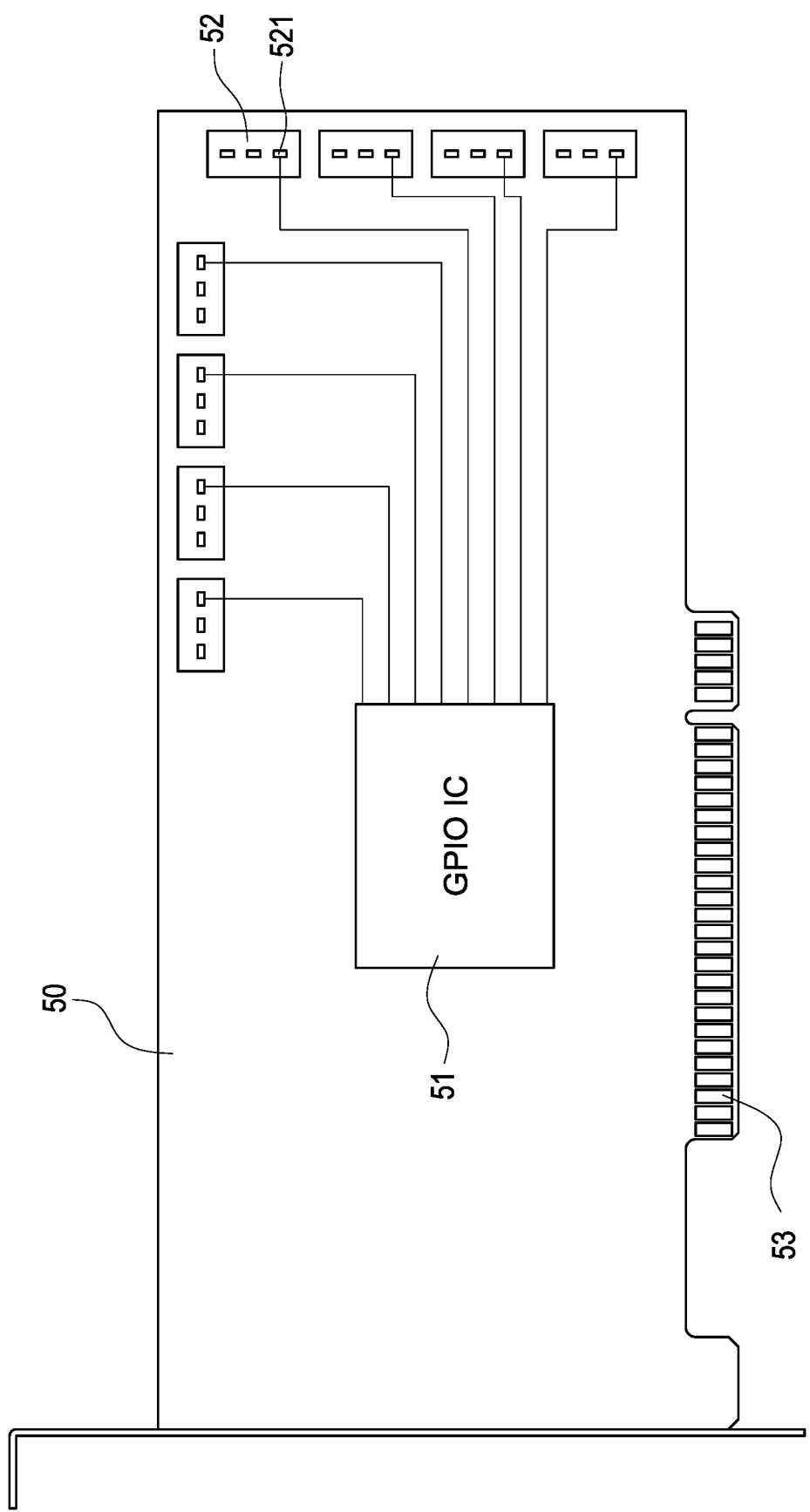
FIG. 5 is a configuration diagram of a GPIO expansion board of the server with the vibration sensing function of the present disclosure.
Figure 6:
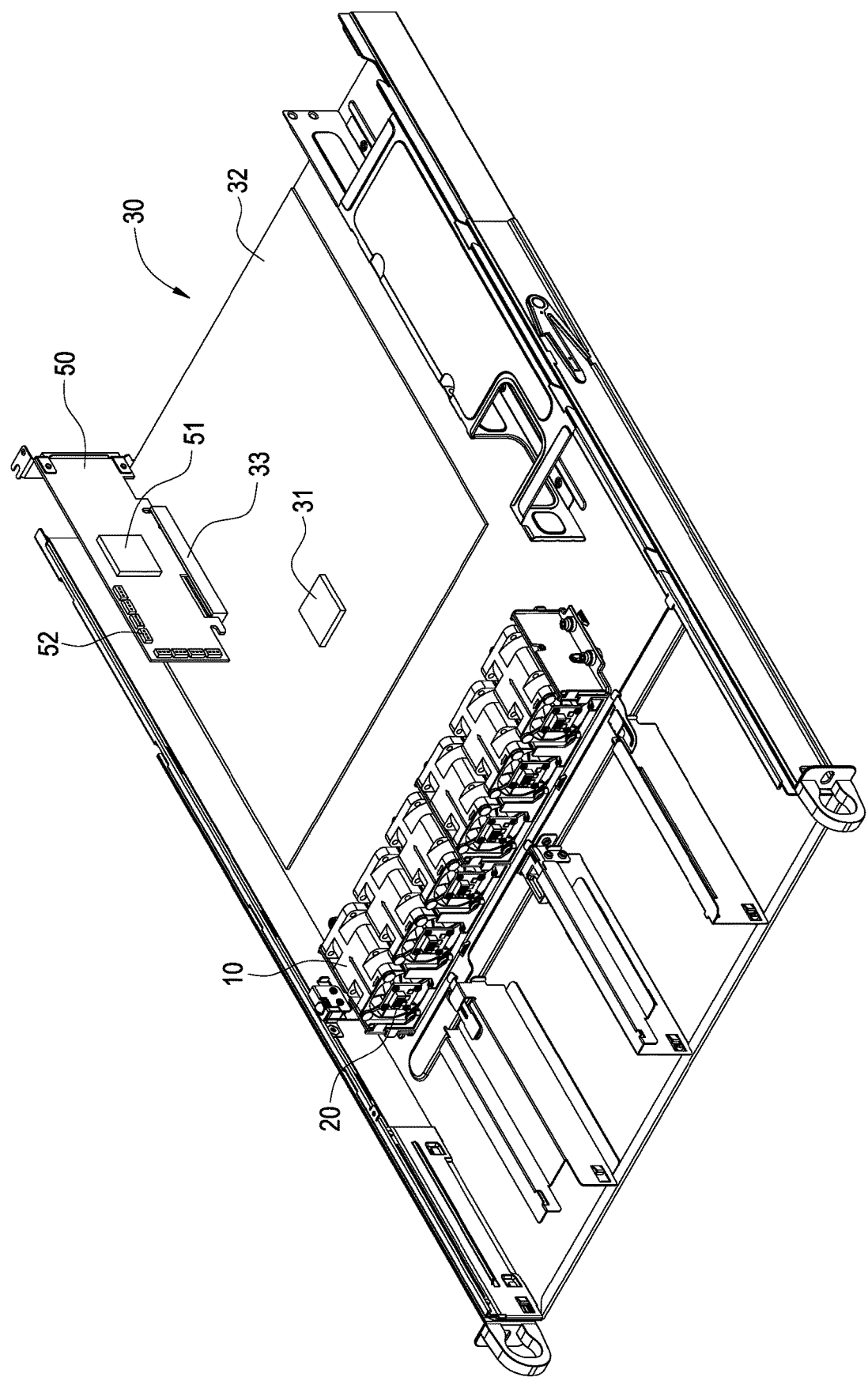
FIG. 6 is a structural configuration diagram of the second embodiment of the server with the vibration sensing function of the present disclosure.

Please refer to FIG. 4 to FIG. 6. FIG. 4 is a functional block diagram of a second embodiment of the server with the vibration sensing function of the present disclosure. FIG. 5 is a configuration diagram of a GPIO expansion board of the server with the vibration sensing function of the present disclosure. FIG. 6 is a structural configuration diagram of the second embodiment of the server with the vibration sensing function of the present disclosure.

In the second embodiment of the present disclosure, the number of the cooling fan 10 and the vibration sensing module 20 are multiple, and each of the vibration sensing module 20 is respectively disposed on the outer surface of the bearing base of the cooling fan 10. Furthermore, compared with the first embodiment, the second embodiment of the present disclosure further includes a motherboard 32 and a GPIO expansion board 50. The GPIO expansion board 50 is configured with a general purpose input and output integrated circuit (GPIO IC) 51, a plurality of ports 52, and a gold finger 53. In the second embodiment of the present disclosure, the GPIO expansion board 50 may be referred to as a PCIe GPIO card (PG card). The CPU 31 is disposed on the motherboard 32, the GPIO IC 51 is disposed on the GPIO expansion board 50, and the GPIO expansion board 50 is removably inserted in a PCIe slot 33 on the motherboard 32. The GPIO IC 51 is coupled to the CPU 31 through the gold finger 53 of the GPIO expansion board 50 and the PCIe slot 33 of the motherboard 32. The plurality of the ports 52 are coupled to the GPIO IC 51, and each of the ports 52 is used to electrically couple one of the vibration sensing modules 20, so that the GPIO IC 51 is electrically coupled to the plurality of the microcontrollers 21. In the second embodiment of the present disclosure, each of the ports 52 has three pins 521 connected the vibration sensing module 20 to outside are +5V, GND, and F/O. The GPIO IC 51 is coupled to a plurality of the vibration sensing modules 20, and each of the vibration sensing modules 20 corresponds to a different of the cooling fan 10. At this time, the GPIO IC 51 can identify any one of the vibration sensing modules 20 that outputs the warning message, further identify which cooling fan 10 was abnormal, and then transmit the warning message to the CPU 31. The CPU 31 can adjust the rotating speed of the cooling fan 10 (for example, reduce the rotating speed or shut down if the temperature conditions allow), and the CPU 31 can also output the warning message to the server, and display the warning message on a screen or make a buzzer sound.

Figure 7:
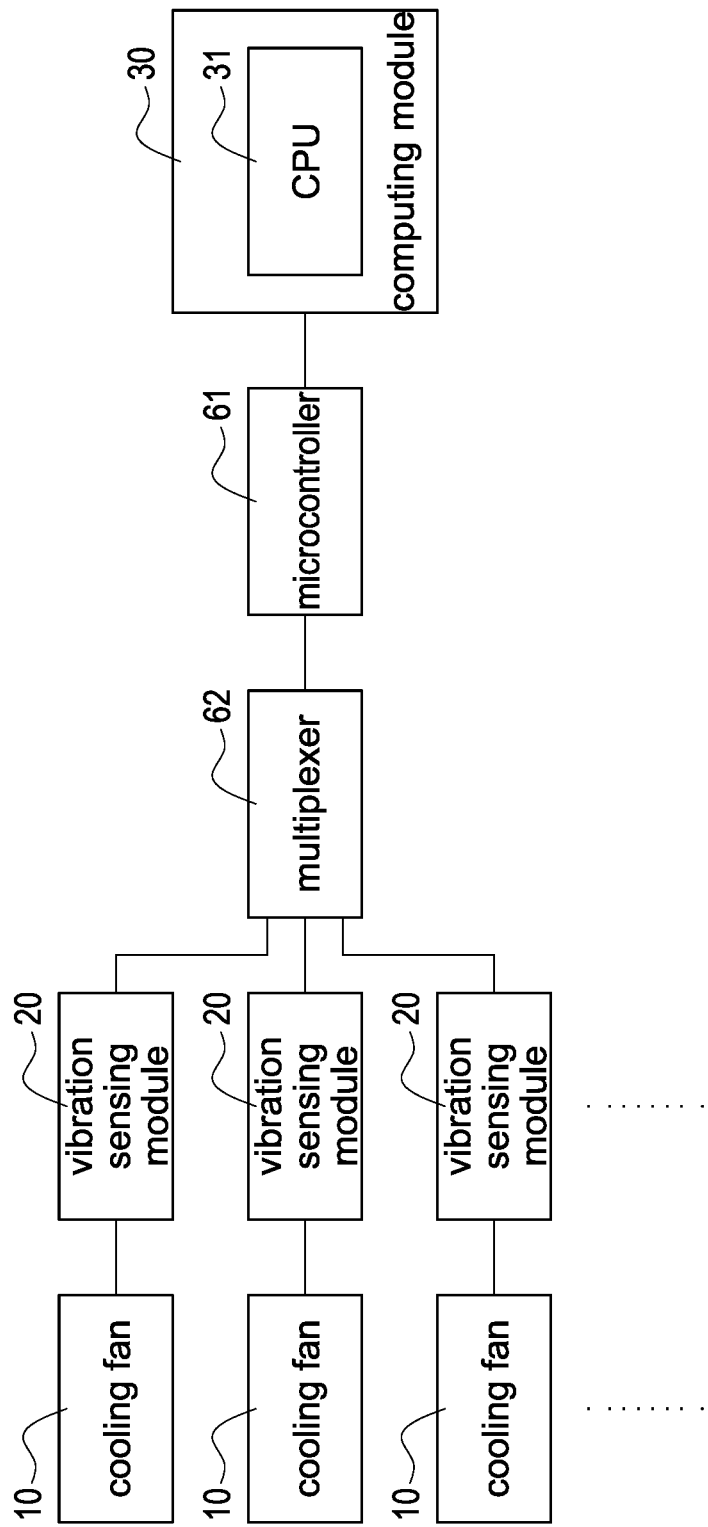
FIG. 7 is a functional block diagram of a third embodiment of the server with the vibration sensing function of the present disclosure.
Figure 8:
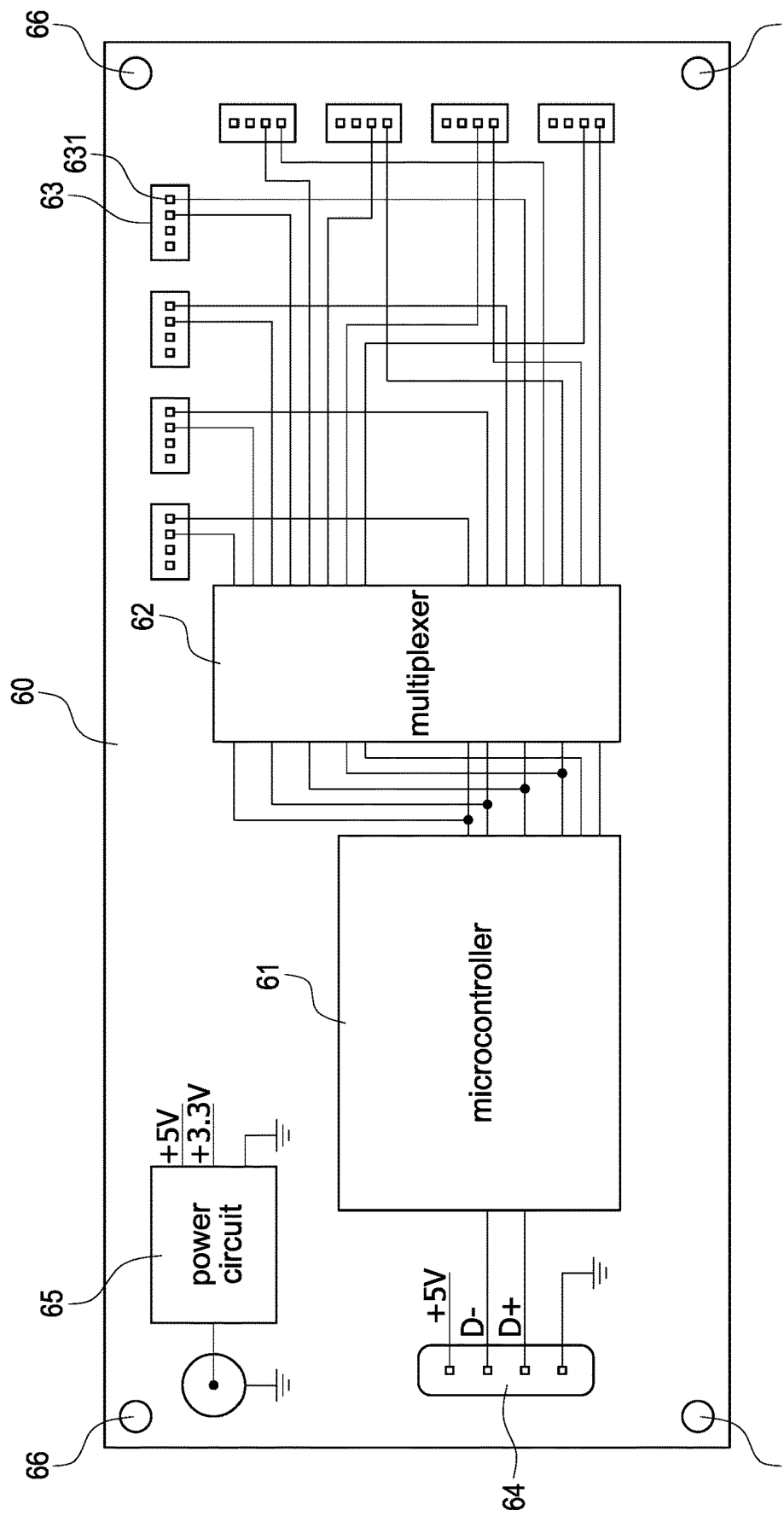
FIG. 8 is the configuration diagram of a USB expansion board of the server with the vibration sensing function of the present disclosure.
Figure 9:
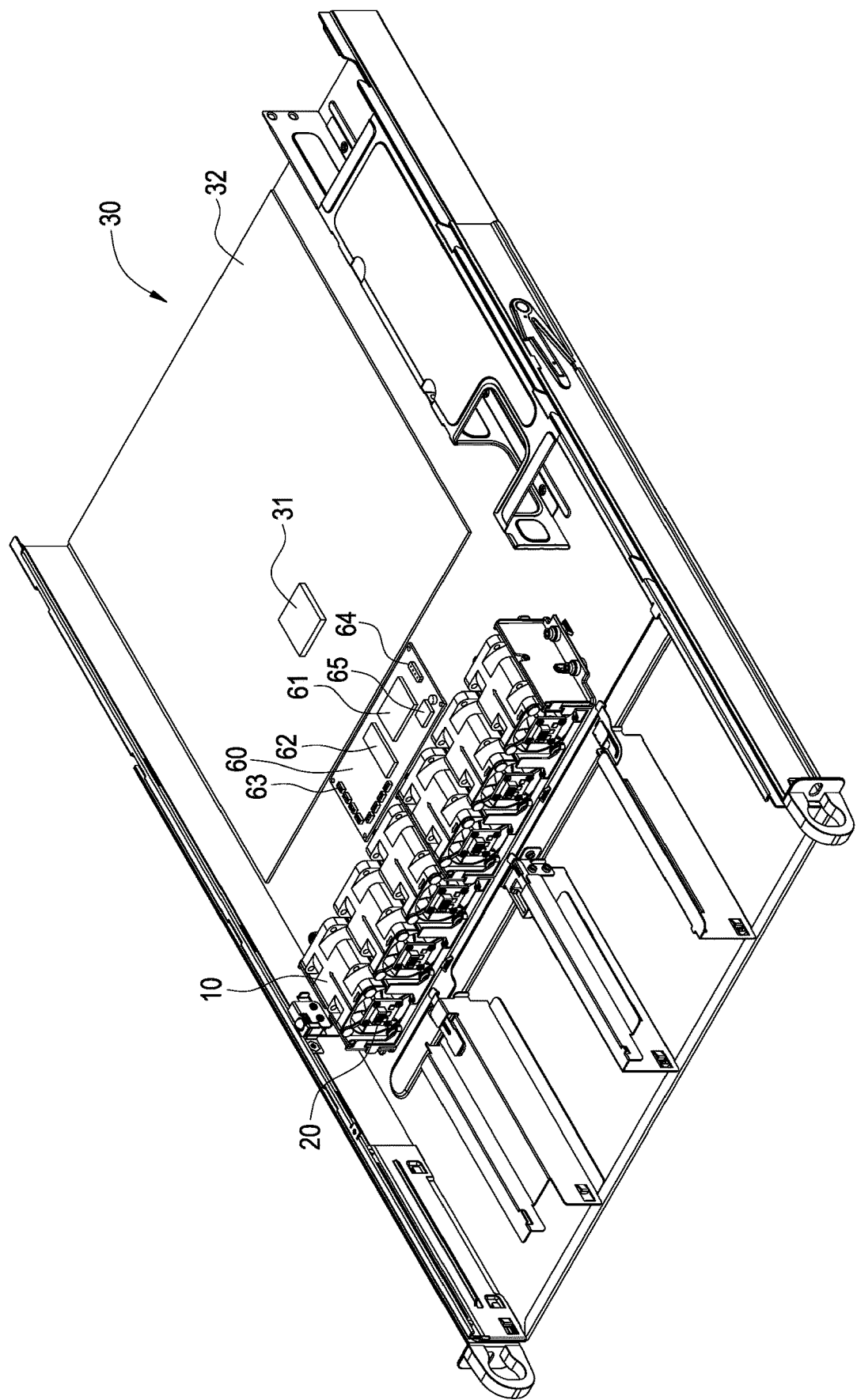
FIG. 9 is a structural configuration diagram of the third embodiment of the server with the vibration sensing function of the present disclosure.

Please refer to FIG. 7 to FIG. 9. FIG. 7 is a functional block diagram of a third embodiment of the server with the vibration sensing function of the present disclosure. FIG. 8 is the configuration diagram of a USB expansion board of the server with the vibration sensing function of the present disclosure. FIG. 9 is a structural configuration diagram of the third embodiment of the server with the vibration sensing function of the present disclosure.

The third embodiment of the present disclosure is substantially the same as the second embodiment, but the third embodiment replaces the GPIO expansion board 50 with a USB expansion board 60. As shown in FIG. 7 and FIG. 8, the USB expansion board 60 includes a second microcontroller (ie, a microcontroller 61), a multiplexer 62, a plurality of ports 63, USB ports 64, a power circuit 65 and a plurality of tapped holes 66. The plurality of the ports 63 are coupled to the multiplexer 62, and each of the ports 63 is electrically coupled one of the vibration sensing modules 20, so that the microcontroller 61 is electrically coupled to the plurality of the microcontrollers 21. Further, the microcontroller 61 may be a flash MCU with 8 bits flash memory. In the third embodiment of the present disclosure, each of the ports 63 has four pins 631 are: +3.3V, +5V, GND, and F/O. The power circuit 65 can receive +5V through the USB port 64 and supply +3.3V to the microcontroller 61 or the multiplexer 62. The multiplexer 62 is coupled to a plurality of the vibration sensing modules 20, and each of the vibration sensing modules 20 corresponds to a different of the cooling fan 10. At this time, the microcontroller 61 can identify any one of the vibration sensing modules 20 that outputs the warning message, and further identify which cooling fan 10 was abnormal, and then the microcontroller 61 transmits the warning message to the CPU 31 through the USB port 64. The CPU 31 can adjust the rotating speed of the cooling fan 10 (for example, reduce the rotating speed or shut down if the temperature conditions allow), and the CPU 31 can also output the warning message to the server, and display the warning message on a screen or make a buzzer sound. Further, the USB port 64 may include four pins: +5V, D−, D+, and GND. In the third embodiment of the present disclosure, the USB expansion board 60 is locked between the motherboard 32 and the plurality of the cooling fans 10 through a plurality of the tapped holes 66 as shown in FIG. 9.

Figure 10:
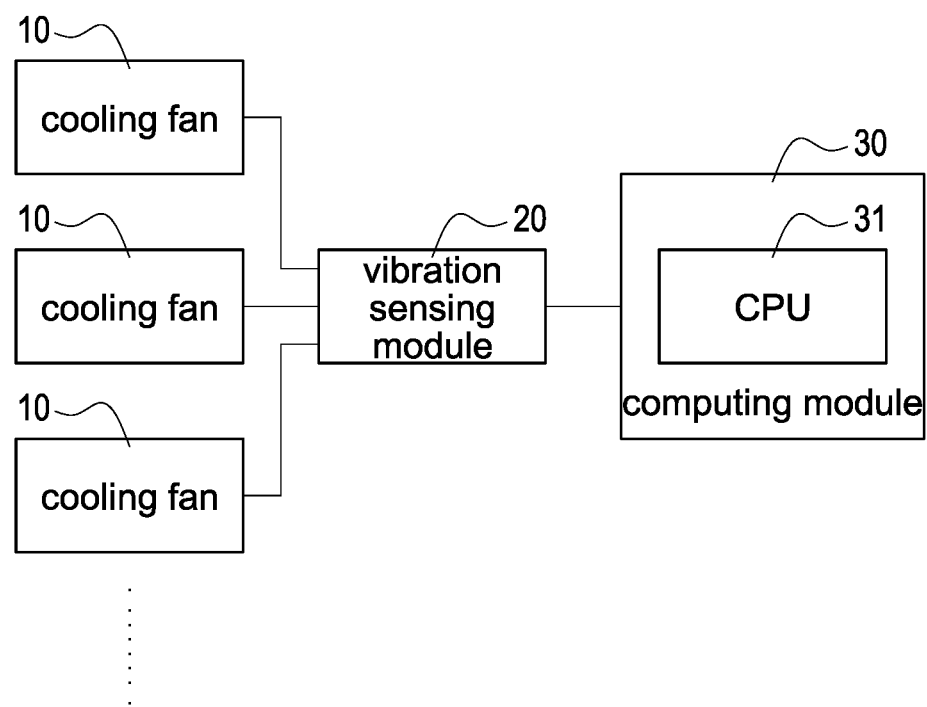
FIG. 10 to FIG. 12 are configuration diagrams of a fourth embodiment of a server with a vibration sensing function of the present disclosure.
Figure 11:
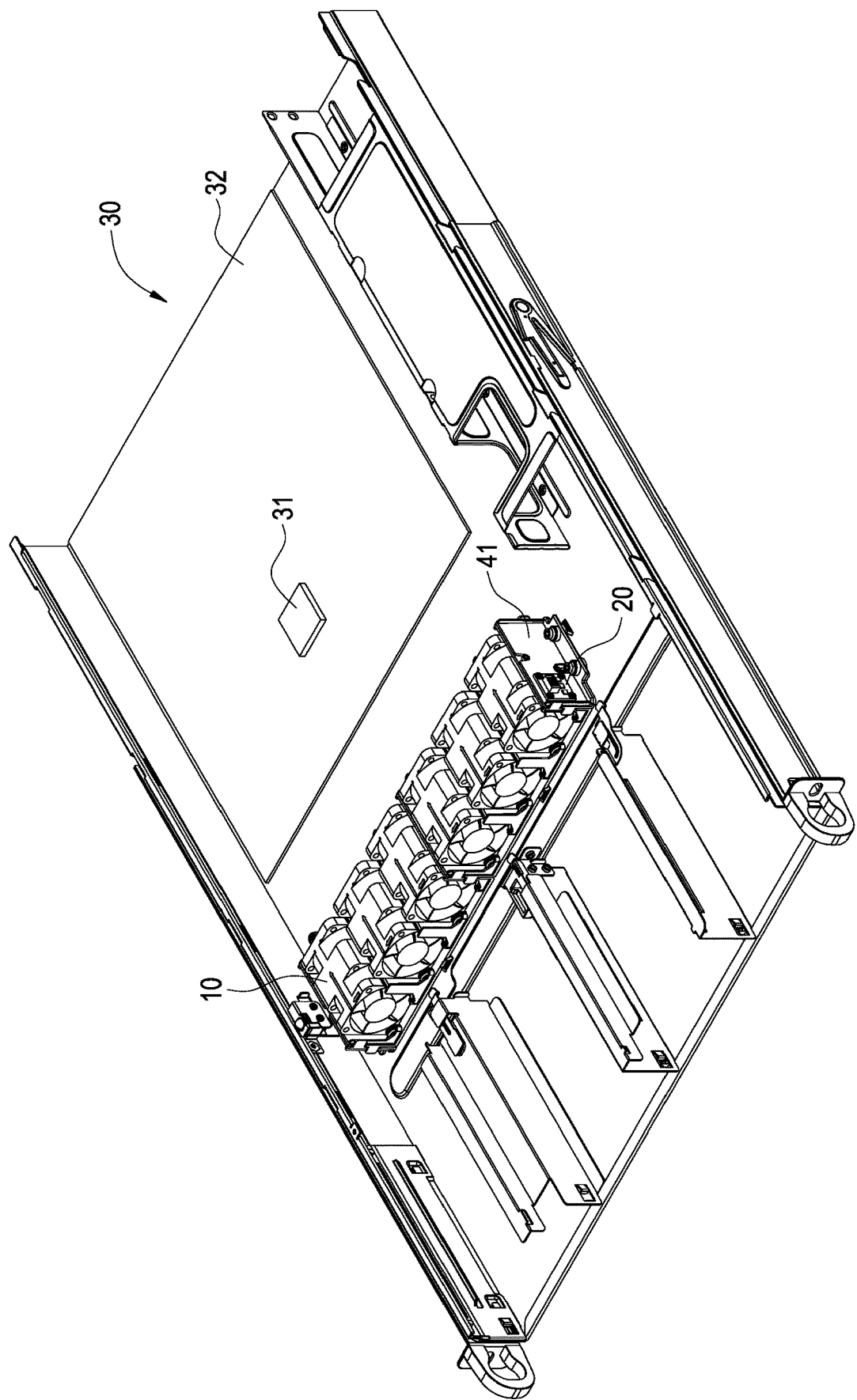
Figure 12:
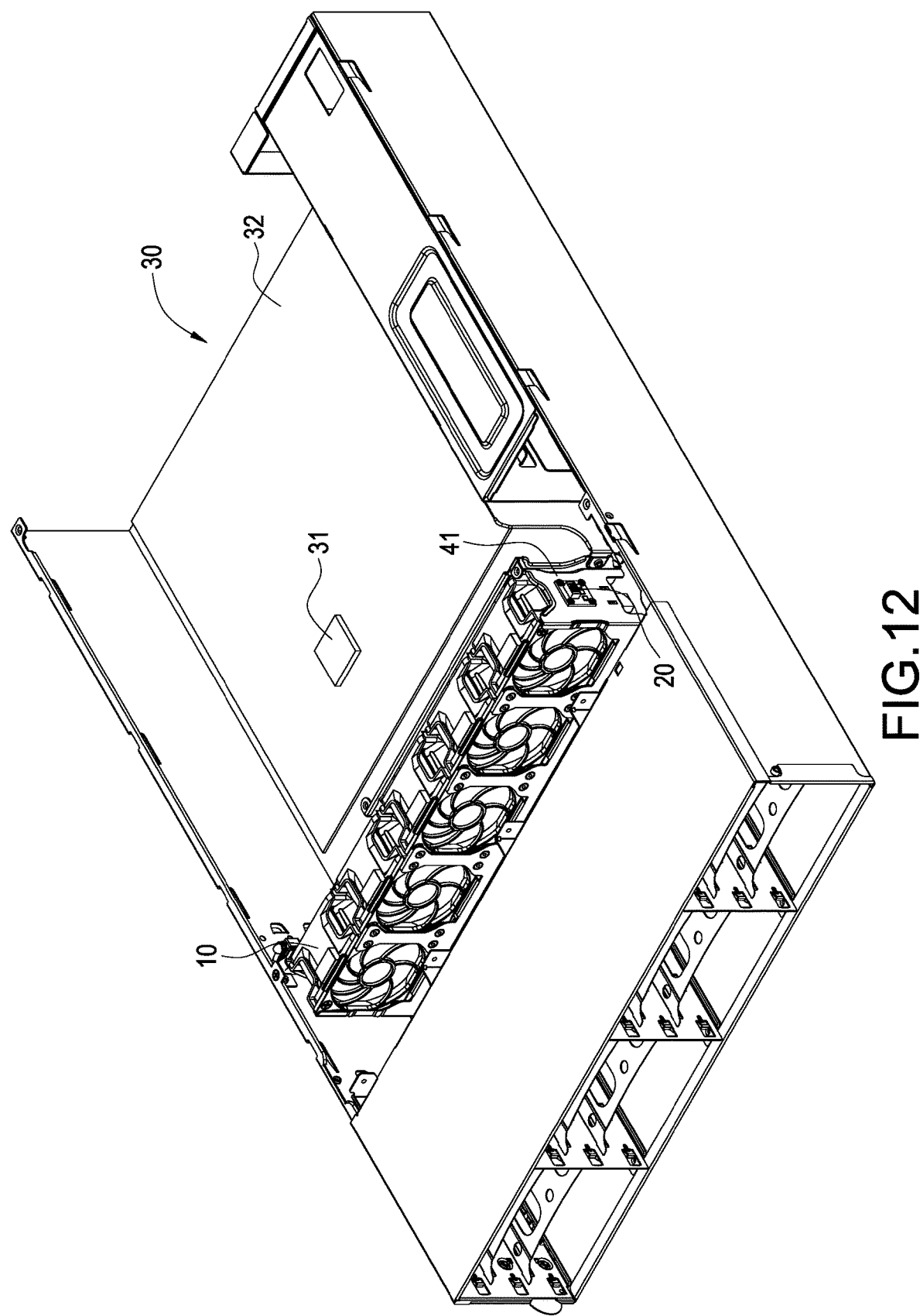

Please refer to FIG. 10 to FIG. 12, that are configuration diagrams of a fourth embodiment of a server with a vibration sensing function of the present disclosure. The fourth embodiment of the present disclosure is substantially the same as the first embodiment, except that the number of the cooling fans 10 is plural. The vibration sensing module 20 is disposed in a fan frame 41 that carries one of the cooling fans 10. That is, a single vibration sensing module 20 detects the vibrations of the plurality of the cooling fans 10 at the same time. The difference between the FIG. 11 and FIG. 12 only structures of the cooling fan 10 and the fan frame 41.

When using the server with a vibration sensing function of the present disclosure, the vibration sensing module 20 can be selected directly (the vibration sensing module 20 is disposed on the outer surface of the bearing base of the cooling fan 10) or indirectly (the vibration sensing module 20 is disposed on a fan frame 41 that carries the cooling fan 10) coupled to the cooling fan 10. When used with the microcontroller 21 and the accelerometer 22, it can have an effect of automatic monitoring. In particular, the threshold value set by the DIP switch 23 is used. The user can further change the setting of the threshold value within the microcontroller 21 by changing the state of the DIP switch 23 (for example, the value of each bit is 0 or 1), so that the microcontroller 21 can compare the threshold value with the monitoring value received, and then deciding whether to output the warning message. For this reason, the server with the vibration sensing function of the present disclosure can actively warn before the cooling fan 10 is about to be damaged, it can not only avoid the problem of resonance of the abnormal vibration, ensuring the reliability of the storage modules, avoiding a damage of electronic apparatus due to high temperature, and achieve the purpose of improving the safety of using the server.

The above is only a detailed description and drawings of the preferred embodiments of the present disclosure, but the features of the present disclosure are not limited thereto, and are not intended to limit the present disclosure. All the scope of the present disclosure shall be subject to the scope of the following claims. The embodiments of the spirit of the present disclosure and its similar variations are intended to be included in the scope of the present disclosure. Any variation or modification that can be easily conceived by those skilled in the art in the field of the present disclosure can be covered by the following claims.

What is claimed is:

1. A server with a vibration sensing function, characterized in that comprising:
    a cooling fan (10) disposed in the server,
    a vibration sensing module (20) disposed in the server and physically coupled to the cooling fan (10), the vibration sensing module (20) including a microcontroller (21), an accelerometer (22) and a DIP switch (23), the DIP switch (23) easily changeable and configured to set a threshold value according to requirements, the accelerometer (22) configured to obtain a monitoring value updated continuously by detecting a vibration of the cooling fan (10), the microcontroller (21) coupled to the accelerometer (22) and the DIP switch (23), when the microcontroller (21) confirms that the monitoring value matches the threshold value, the microcontroller (21) outputs a warning message, and
    a computing module (30) disposed in the server and electrically coupled to the vibration sensing module (20), the computing module (30) including a central processing unit (CPU) (31), and the CPU (31) receiving the warning message.

2. The server with the vibration sensing function in claim 1, characterized in that the vibration sensing module (20) is disposed on an outer surface of a bearing base of the cooling fan (10), and the accelerometer (22) is configured to detect the vibration of the cooling fan (10) by detecting a vibration of the outer surface of the bearing base.

3. The server with the vibration sensing function in claim 1, characterized in that the number of the cooling fan (10) and the vibration sensing module (20) are multiple, and each of the vibration sensing modules (20) is respectively disposed on an outer surface of a bearing base of the cooling fan (10).

4. The server with the vibration sensing function in claim 3, characterized in that further comprising a general purpose input and output integrated circuit (GPIO IC) (51), the GPIO IC (51) coupled to a plurality of the vibration sensing modules (20), the GPIO IC (51) configured to identify any one of the vibration sensing modules (20) that outputs the warning message, and configured to transmit the warning message to the CPU (31).

5. The server with the vibration sensing function in claim 4, characterized in that further comprising a motherboard (32) and a GPIO expansion board (50) removably inserted on the motherboard (32), the CPU (31) disposed on the motherboard (32), the GPIO IC (51) disposed on the GPIO expansion board (50), and the GPIO IC (51) coupled to the CPU (31) through the GPIO expansion board (50) and the motherboard (32).

6. The server with the vibration sensing function in claim 5, characterized in that the GPIO expansion board (50) includes a plurality of ports (52), the plurality of the ports (52) are coupled to the GPIO IC (51), and each of the plurality of the ports (52) is electrically coupled to one of the vibration sensing modules (20), so that the GPIO IC (51) is electrically coupled to a plurality of the microcontrollers (21).

7. The server with the vibration sensing function in claim 4, characterized in that further comprising a motherboard (32) and a USB expansion board (60), the CPU (31) disposed on the motherboard (32), the USB expansion board (60) locked between the motherboard (32) and a plurality of the cooling fans (10), the USB expansion board (60) including a second microcontroller (61), a multiplexer (62), a plurality of ports (63), a USB port (64), a power circuit (65), and a plurality of tapped holes (66), each of the plurality of the ports (63) electrically coupled to one of the vibration sensing modules (20), the multiplexer (62) coupled to the plurality of the vibration sensing modules (20) through the plurality of the ports (63), so that the second microcontroller (61) configured to identify any one of the vibration sensing modules (20) that outputs the warning message, and configured to transmit the warning message to the CPU (31) through the USB port (64), the power circuit (65) configured to supply power to the second microcontroller (61) or the multiplexer (62) through the USB port (64).

8. The server with the vibration sensing function in claim 1, characterized in that the vibration sensing module (20) is disposed on a fan frame (41) that carries the cooling fan (10), and the accelerometer (22) is configured to detect the vibration of the cooling fan (10) by detecting a vibration of the fan frame (41).

9. The server with the vibration sensing function in claim 1, characterized in that the number of the cooling fans (10) is plural, and the vibration sensing module (20) is disposed on a fan frame (41) that carries one of the cooling fans (10) or carries all the cooling fans (10), and the accelerometer (22) is configured to detect the vibration of the cooling fan (10) by detecting a vibration of the fan frame (41).

10. The server with the vibration sensing function in claim 1, characterized in that when the microcontroller (21) continuously confirms that the monitoring value matches the threshold value during a specific period, the microcontroller (21) is configured to output the warning message to the CPU (31).

11. The server with the vibration sensing function in claim 9, characterized in that the specific period is 10 seconds.

12. The server with the vibration sensing function in claim 1, characterized in that the unit of the monitoring value and the threshold value is acceleration.

13. The server with the vibration sensing function in claim 1, characterized in that when the CPU (31) receives the warning message, the CPU (31) is configured to output the warning message to outside of the server, and is configured to display the warning message on a screen or make a buzzer sound.

14. The server with the vibration sensing function in claim 1, characterized in that when the CPU (31) receives the warning message, the CPU (31) is configured to adjust a rotating speed of the cooling fan (10).

\* \* \* \* \*